United States Patent
Cao et al.

(10) Patent No.: US 8,962,442 B2
(45) Date of Patent: Feb. 24, 2015

(54) JANUS COMPLEMENTARY MEMS TRANSISTORS AND CIRCUITS

(71) Applicant: International Business Machines Corporation, Armonk, NY (US)

(72) Inventors: Qing Cao, Yorktown Heights, NY (US); Zhengwen Li, Scarsdale, NY (US); Fei Liu, Yorktown Heights, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 13/940,568

(22) Filed: Jul. 12, 2013

(65) Prior Publication Data

US 2015/0014755 A1    Jan. 15, 2015

(51) Int. Cl.
*H01L 21/76* (2006.01)
*H01L 27/092* (2006.01)
*H01L 21/8238* (2006.01)

(52) U.S. Cl.
CPC ...... *H01L 27/092* (2013.01); *H01L 21/823814* (2013.01)
USPC ............... 438/409; 257/14; 257/27; 257/236; 257/365

(58) Field of Classification Search
CPC ......... H01L 21/76; H01L 29/06; H01L 29/68; H01L 29/86; H01L 27/092
USPC ............ 438/408, 409, 441, 800, 900; 257/14, 257/27, 235, 236, 365
See application file for complete search history.

(56) References Cited

U.S. PATENT DOCUMENTS

| | | | |
|---|---|---|---|
| 6,984,842 B1 * | 1/2006 | Nayfeh et al. | 257/14 |
| 7,709,544 B2 * | 5/2010 | Doyle et al. | 522/3 |
| 7,767,017 B2 * | 8/2010 | Lahann et al. | 106/401 |
| 8,309,185 B2 | 11/2012 | Lin et al. | |
| 8,614,136 B1 * | 12/2013 | Cao et al. | 438/409 |

(Continued)

FOREIGN PATENT DOCUMENTS

| | | |
|---|---|---|
| CN | 102675547 A | 9/2012 |
| JP | 2003092475 A | 3/2003 |
| WO | WO2012172522 A1 | 12/2012 |

OTHER PUBLICATIONS

Computer translation of CN102675547A, filed by Zhenzhong Yang et al. (published Sep. 19, 2012).

(Continued)

*Primary Examiner* — Telly Green
(74) *Attorney, Agent, or Firm* — Louis J. Percello; Michael J. Chang, LLC

(57) ABSTRACT

A method of fabricating an electromechanical device includes the following steps. A first and a second back gate are formed over a substrate. An etch stop layer is formed covering the first and second back gates. Electrodes are formed over the first and second back gates, wherein the electrodes include one or more gate, source, and drain electrodes, wherein gaps are present between the source and drain electrodes. One or more Janus components are placed the gaps, each of which includes a first portion having an electrically conductive material and a second portion having an electrically insulating material, and wherein i) the first or second portion of the Janus components placed in a first one of the gaps has a fixed positive surface charge and ii) the first or second portion of the Janus components placed in a second one of the gaps has a fixed negative surface charge.

15 Claims, 12 Drawing Sheets

(56) References Cited

U.S. PATENT DOCUMENTS

2006/0124922 A1  6/2006  Kim et al.
2011/0274913 A1  11/2011  Lin et al.
2013/0030120 A1  1/2013  Lin et al.

OTHER PUBLICATIONS

Computer translation of JP2003092475A, filed by Haneda Yuichi et al. (published Mar. 28, 2003).

* cited by examiner

Negative Charge:
pyridine

Positive Charge:
diazonium

Relay

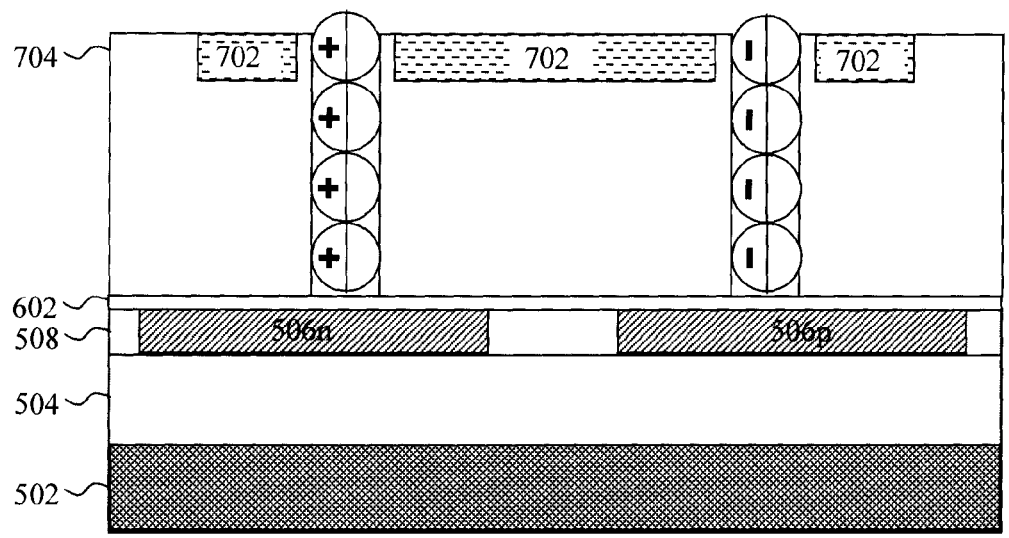
FIG. 19
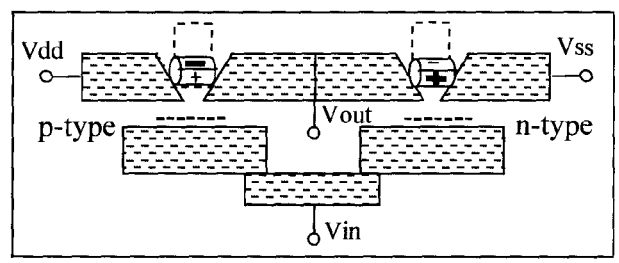
FIG. 20
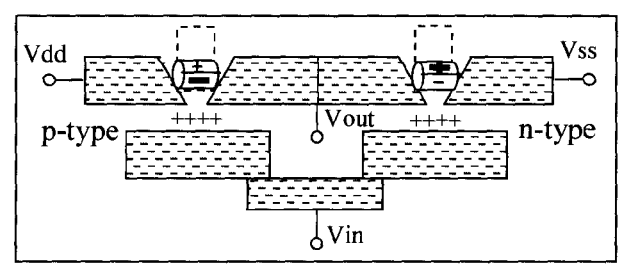

+Vin

JANUS COMPLEMENTARY MEMS TRANSISTORS AND CIRCUITS

FIELD OF THE INVENTION

The present invention relates to electromechanical devices, and more particularly, to transistors and circuits that employ complementary Janus micro/nano-components (e.g., Janus particles, cylinders, prisms, etc.) and techniques for the fabrication thereof.

BACKGROUND OF THE INVENTION

Microelectromechanical (MEMS) and nanoelectromechanical (NEMS) devices have been implemented in a number of different applications, such as relays. Because they are mechanical, MEMS and NEMS can reduce standby leakage current. Electromechanical devices also potentially have better sub-threshold behavior than transistors (which are limited by 60 mV/dec.).

Relays need to have low switching voltage and high endurance. However, many conventional MEMS and NEMS devices rely on a cantilever design wherein a cantilever structure (e.g., a polysilicon arm or array of arms) actuates during operation of the device. Thus the reliability of these conventional devices can be an issue. Reliability refers to a lifetime of the electromechanical switch, for example how many times the electromechanical transistor can be switched on and off, how long the electromechanical transistor can stay on with resistance less than a certain value, etc.

Therefore, an improved electromechanical device that does not suffer from the above-described drawbacks would be desirable.

SUMMARY OF THE INVENTION

The present invention provides transistors and circuits that employ complementary Janus micro/nano-components (e.g., Janus particles, cylinders, prisms, etc.) and techniques for the fabrication thereof. In one aspect of the invention, a method of fabricating an electromechanical device is provided. The method includes the following steps. A first back gate and a second back gate are formed on a first dielectric layer over a substrate. An etch stop layer is formed covering the first back gate and a second back gate. Electrodes are formed in a second dielectric layer on the etch stop layer over the first back gate and the second back gate, wherein the electrodes include one or more gate electrodes, one or more source electrodes and one or more drain electrodes, wherein gaps are present between the source electrodes and the drain electrodes, and wherein the gate electrodes are located adjacent to the gaps, perpendicular to the source and drain electrodes. One or more Janus components are placed in each of the gaps between the source and drain electrodes, wherein each of the Janus components includes a first portion having an electrically conductive material and a second portion having an electrically insulating material, and wherein i) either the first portion or the second portion of the Janus components placed in a first one of the gaps has a fixed positive surface charge and ii) either the first portion or the second portion of the Janus components placed in a second one of the gaps has a fixed negative surface charge.

In another aspect of the invention, an electromechanical device is provided. The device includes: a first back gate and a second back gate on a first dielectric layer over a substrate; an etch stop layer covering the first back gate and a second back gate; electrodes formed in a second dielectric layer on the etch stop layer over the first back gate and the second back gate, wherein the electrodes include one or more gate electrodes, one or more source electrodes and one or more drain electrodes, wherein gaps are present between the source electrodes and the drain electrodes, and wherein the gate electrodes are located adjacent to the gaps, perpendicular to the source and drain electrodes; and one or more Janus components placed in each of the gaps between the source and drain electrodes, wherein each of the Janus components includes a first portion having an electrically conductive material and a second portion having an electrically insulating material, and wherein i) either the first portion or the second portion of the Janus components placed in a first one of the gaps has a fixed positive surface charge and ii) either the first portion or the second portion of the Janus components placed in a second one of the gaps has a fixed negative surface charge.

In yet another aspect of the invention, a method of operating an electromechanical device is provided. The method includes the following steps. The electromechanical device is provided. The electromechanical device includes a first back gate and a second back gate on a first dielectric layer over a substrate; an etch stop layer covering the first back gate and a second back gate; electrodes formed in a second dielectric layer on the etch stop layer over the first back gate and the second back gate, wherein the electrodes comprise one or more gate electrodes, one or more source electrodes and one or more drain electrodes, wherein gaps are present between the source electrodes and the drain electrodes, and wherein the gate electrodes are located adjacent to the gaps, perpendicular to the source and drain electrodes; and one or more Janus components placed in each of the gaps between the source and drain electrodes, wherein each of the Janus components includes a first portion having an electrically conductive material and a second portion having an electrically insulating material, and wherein i) either the first portion or the second portion of the Janus components placed in a first one of the gaps has a fixed positive surface charge and ii) either the first portion or the second portion of the Janus components placed in a second one of the gaps has a fixed negative surface charge. A gate voltage is applied to the gate electrodes to move the Janus components so as to position either: a) the first portion of the Janus components placed in the first one of the gaps between a first set of the source and drain electrodes and the second portion of the Janus components placed in the second one of the gaps between a second set of the source and drain electrodes, or b) the second portion of the Janus components placed in the first one of the gaps between the first set of the source and drain electrodes and the first portion of the Janus components placed in the second one of the gaps between the second set of the source and drain electrodes.

A more complete understanding of the present invention, as well as further features and advantages of the present invention, will be obtained by reference to the following detailed description and drawings.

BRIEF DESCRIPTION OF THE DRAWINGS

FIG. 19 is a cross-sectional diagram illustrating multiple Janus particles connected in parallel in each (n-type or p-type) transistor according to an embodiment of the present invention;

FIG. 20 is a diagram illustrating operation of the present complementary Janus component devices where the Janus components are the Janus cylinders of FIG. 1C according to an embodiment of the present invention;

DETAILED DESCRIPTION OF PREFERRED EMBODIMENTS

Figure 1A:
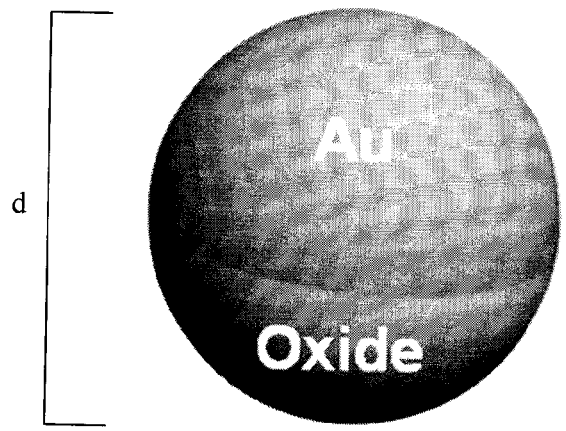
FIG. 1A is a three-dimensional diagram illustrating an exemplary Janus particle which may be used in accordance with the present techniques according to an embodiment of the present invention.

Provided herein are complementary electromechanical devices (e.g., transistors) and circuits for ultra-low-power (i.e., reduced leakage power and lower supply power Vdd) digital integrated circuit applications that employ Janus micro/nano-components (e.g., Janus particles, cylinders, prisms, etc.—see below) and techniques for the fabrication thereof. In general, a Janus micro/nano-component is a particle, cylinder, prism, etc. the surface of which has two (or more) distinct physical properties. For instance, as will be described in detail below, the Janus micro/nano-component could be composed of two different materials. In order to form complementary devices/circuits, the present devices will employ complementary positively and negatively charged Janus components the position and rotation of which is controlled by pairs of negatively and positively charged back gates. As will be described in detail below, electrical contact is formed in the devices when the Janus components form a bridge between the device's source and drain contacts.

The use of Janus micro/nano-components in an electromechanical sensor has several notable benefits: 1) Janus micro/nano-components-based electromechanical devices have a lower control gate voltage, 2) Janus micro/nano-components-based electromechanical devices exhibit better reliability than conventional electromechanical devices, 3) Janus micro/nano-components-based electromechanical devices can be fabricated at a lower cost than conventional electromechanical devices, and 4) Janus micro/nano-components-based electromechanical devices have applicability to bio-medical applications (e.g., bioswitches).

FIGS. 1A-D are three-dimensional diagrams illustrating exemplary Janus micro/nano-components that may be used in accordance with the present techniques. There are currently three methods known for fabricating Janus particles, cylinders, prisms, etc. See for example Lattuada et al., "Synthesis, properties and applications of Janus nanoparticles," nanotoday, vol. 6, Issue 3, June 2011, pages 286-308 (hereinafter "Lattuada"), the contents of which are incorporated by reference herein. For instance as described in Lattuada, one method for fabricating Janus particles is via self-assembly of block copolymers, and mixtures of ligands on the surfaces of the nanoparticles. Another method for fabricating Janus particles is through a masking step in which particles are trapped at the interface between two phases, so that a modification to the particle surface is made only on one side. Yet another method for fabricating Janus particles relies on the phase separation of two different substances, usually either two polymers, or a polymer and an inorganic material.

According to an exemplary embodiment, the Janus micro/nano-components used in accordance with the present techniques include a first portion made of a first material which is an electrically conducting material, such as a metal(s), and a second portion made of a second material which is an electrically insulating material, such as a dielectric material (e.g., an oxide or nitride dielectric material). See for example FIG. 1A which depicts an exemplary Janus particle which may be used in accordance with the present techniques. The Janus particle shown in FIG. 1A has one hemisphere composed of a metal (in this case gold (Au)) and a second hemisphere composed of a dielectric material (in this case an oxide dielectric material). Thus one portion of the particle is electrically conductive and another portion is not electrically conductive. Gold (Au) is an appropriate metal for use in the present Janus components since it is relatively abundant and is biocompatible, however other metals may be employed. By way of example only, suitable metals for use as the electrically conductive portion in the present Janus components include, but are not limited to, gold (Au), copper (Cu), aluminum (Al), silver (Ag), and palladium (Pd).

As highlighted above, the geometries of the Janus micro/nano-components (also referred to herein generally as "Janus components") are scalable. In the case of a Janus particle like that shown in FIG. 1A, the dimensions of the particle may be measured based on the diameter d of the particle. By way of example only, the Janus particle may have a diameter d of from about 20 nanometers (nm) to about 20 micrometers (pin). Further, when the Janus particle has a diameter d of from about 100 nanometers (nm) to about 20 micrometers (m) it is considered herein to be a Janus microcomponent and when the Janus particle has a diameter d of from about 20 nm to about 100 nm it is considered herein to be a Janus nanocomponent.

Figure 1B:
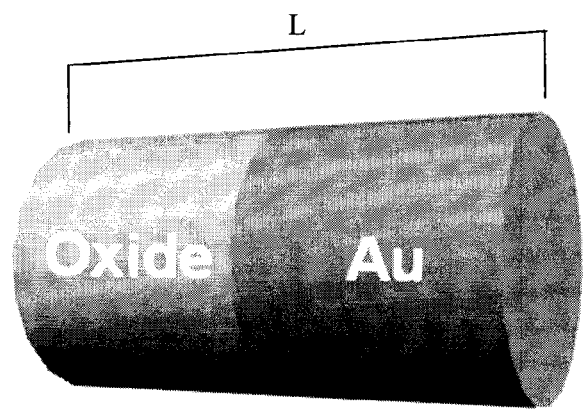
FIG. 1B is a three-dimensional diagram illustrating an exemplary Janus cylinder which may be used in accordance with the present techniques according to an embodiment of the present invention.

FIG. 1B is a diagram which depicts an exemplary Janus cylinder which may be used in accordance with the present techniques. The Janus cylinder shown in FIG. 1B is composed of a metal (in this case Au) along one portion of its length and a dielectric material (in this case an oxide dielectric) along another portion of its length. Thus one portion of the cylinder is electrically conductive and another portion is not electrically conductive. As provided above, in addition to Au, other suitable metals for forming the electrically conductive portion of the Janus component include, but are not limited to, Cu, Al, Ag, and Pd.

The dimensions of the Janus cylinder shown in FIG. 1B may be measured based on the length L of the cylinder. By way of example only, the Janus cylinder may have a length L of from about 20 nm to about 100 μm. Further, when the Janus cylinder has a length L of from about 100 nm to about 100 μm it is considered herein to be a Janus microcomponent and when the Janus cylinder has a length L of from about 20 nm to about 100 nm it is considered herein to be a Janus nanocomponent.

Figure 1C:
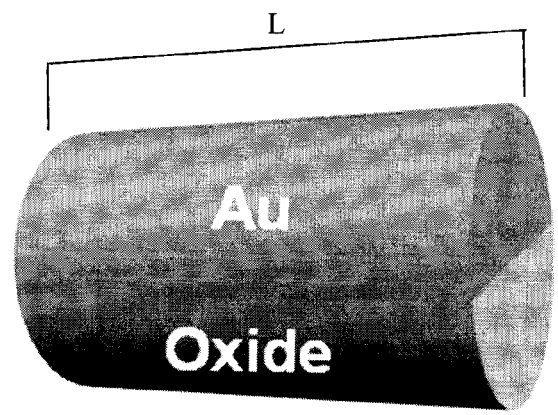
FIG. 1C is a three-dimensional diagram illustrating another exemplary Janus cylinder which may be used in accordance with the present techniques according to an embodiment of the present invention.

FIG. 1C is a diagram which depicts another exemplary Janus cylinder which may be used in accordance with the present techniques. By comparison with the Janus cylinder shown in FIG. 1B, this Janus cylinder is composed of a metal (in this case Au) along (the entire length of) one side of the cylinder and a dielectric material (in this case an oxide dielectric material) along (the entire length of) another side of the cylinder. Thus one side of the cylinder is electrically conductive and another side is not electrically conductive. Exemplary Janus cylinder dimensions were provided above. Gold (Au) is being used here merely as an example. As provided above, in addition to Au, other suitable metals for forming the electrically conductive portion of the Janus component include, but are not limited to, Cu, Al, Ag, and Pd.

Figure 1D:
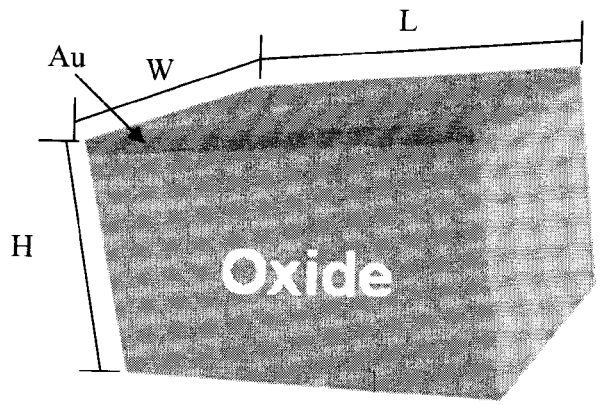
FIG. 1D is a three-dimensional diagram illustrating an exemplary Janus prism which may be used in accordance with the present techniques according to an embodiment of the present invention.

FIG. 1D is a diagram which depicts an exemplary Janus prism which may be used in accordance with the present techniques. The Janus prism shown in FIG. 1D has one portion composed of a metal (in this case Au) and a second portion composed of a dielectric material (in this case an oxide dielectric material). Thus one portion of the prism is electrically conductive and another portion is not electrically conductive. FIG. 1D also illustrates that the conductive and non-conductive portions of the Janus component do not have to be the same size. For instance in the examples shown in FIGS. 1A-C, the metal and oxide portions are shown to be the same size as one another. In the example shown in FIG. 1D, the metal portion makes up only one side of the prism while the remainder of the prism is the oxide. Again, gold (Au) is being used here merely as an example. As provided above, in addition to Au, other suitable metals for forming the electrically conductive portion of the Janus component include, but are not limited to, Cu, Al, Ag, and Pd.

The dimensions of the Janus prism shown in FIG. 1D may be measured based on the length L, width W and height H of the prism. By way of example only, the Janus prism may have a length L, width W and height H each of from about 20 nm to about 20 μm. Further, when the Janus prism has a length L, width W, and height H each of from about 100 nm to about 20 μm it is considered herein to be a Janus microcomponent and when the Janus prism has a length L, width W, and height H each of from about 20 nm to about 100 nm it is considered herein to be a Janus nanocomponent.

As highlighted above, complementary Janus components are used herein to form devices and circuits, wherein one (or more) of the Janus components in the device is/are positively charged and one (or more) other of the Janus components in the device is/are negatively charged. To do so, a fixed (positive or negative) charge is created on the surface of the metal portion and/or on the surface of the dielectric portion of the Janus components.

Figure 2:
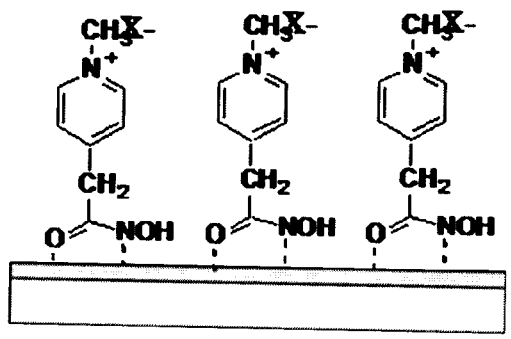
FIG. 2 is a diagram illustrating a molecule containing hydroxamic groups and bearing negatively charged (pyridine) groups being used to create a fixed negative charge on the surface of the dielectric portions of the Janus components according to an embodiment of the present invention.

More specifically, a fixed negative charge can be created on the surface of the dielectric portions of the Janus components using a molecule containing a hydroxamic group:

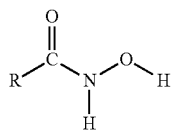

and negatively charged functional groups (e.g., pyridine groups). See, for example, FIG. 2. A hydroxamic group is preferred for anchoring the molecules to a dielectric (e.g., oxide or nitride) surface. Thus, by way of the hydroxamic group, the molecules will self-assemble on the surface of the dielectric portions of the Janus components forming a (self-assembled) monolayer on those dielectric surfaces bearing a negative charge. Selective modification of a Janus component is described for example in Roh et al., "Biphasic Janus particles with nanoscale anisotropy," Nature Materials, vol. 4 (October 2005) (which describes, for example, biphasic jetting) and in Perro et al., "Design and synthesis of Janus micro- and nanoparticles," J. Mater. Chem., 15, 3745-3760 (2005) (which describes for example surface modification of partially-masked particles), the contents of each of which is incorporated by reference herein.

Figure 3:
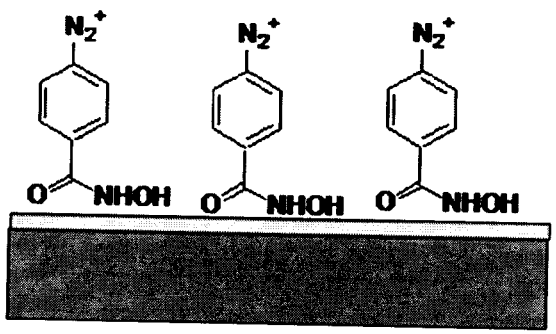
FIG. 3 is a diagram illustrating a molecule containing hydroxamic groups and bearing positively charged (diazonium) groups being used to create a fixed positive charge on the surface of the dielectric portions of the Janus components according to an embodiment of the present invention.

In the same manner, a fixed positive charge can be created on the surface of the dielectric portions of the Janus components using a molecule containing a hydroxamic group and positively charged functional groups (e.g., diazonium groups). See, for example, FIG. 3. As provided above, based on the affinity of the hydroxamic group for reaction with a dielectric (e.g., oxide or nitride), the molecules will self-assemble on the surface of the dielectric portions of the Janus components forming a (self-assembled) monolayer on those dielectric surfaces bearing a positive charge.

To form a fixed (positive or negative) charge selectively on the surfaces of the metal portions of the Janus components, the same (positively or negatively charged) functional groups can be employed, but another group is needed to anchor the molecule to the metal surface. A suitable anchoring group for a metal surface is a thiol (—SH). Specifically, a fixed negative charge can be created on the surface of the metal portions of the Janus components using a molecule containing a thiol group and negatively charged functional groups (e.g., pyridine groups). Based on the affinity of the thiol group for reaction with a metal (e.g., gold), the molecules will self-assemble on the surface of the metal portions of the Janus components forming a (self-assembled) monolayer on those dielectric surfaces bearing a negative charge.

Similarly, a fixed positive charge can be created on the surface of the metal portions of the Janus components using a molecule containing a thiol group and positively charged functional groups (e.g., diazonium groups). Based on the affinity of the thiol group for reaction with a metal (e.g., gold), the molecules will self-assemble on the surface of the metal portions of the Janus components forming a (self-assembled) monolayer on those dielectric surfaces bearing a positive charge. Techniques for creating a fixed charge on a Janus component are described, for example, in U.S. patent application Ser. No. 13/665,334 filed on Oct. 31, 2012, entitled "Techniques for Fabricating Janus MEMS Transistors," (hereinafter "U.S. patent application Ser. No. 13/665,334") the contents of which are incorporated by reference herein.

As highlighted above, in order to form a complementary device/circuit, at least one of the Janus components has to have a fixed positive charge on a portion of its surface and at least one other Janus component has to have a fixed negative charge on a portion of its surface. Given the above-described process, it is apparent that according to the present techniques, this combination of positively and negatively charged Janus components can be achieved in a number of different ways. For instance, one may simply create a fixed positive charge on the surface of the dielectric portion of one or more of the Janus components, and a fixed negative charge on the surface of the dielectric portion of one or more other of the Janus components. The same process outlined above could instead be used to create positive/negative charges on the surfaces of the metal portions of the Janus components. Further, any combination of positively charged/negatively charged/uncharged metal/dielectric surfaces may be employed as long as: i) a portion (dielectric or metal) of each of the Janus components has a fixed (positive or negative) charge (while the other portion (dielectric or metal) has the opposite charge or no fixed charge), and ii) at least one of the Janus components has a fixed (positive or negative) charge that is opposite to the fixed (positive or negative) charge on at least one other Janus component. To use a simple example where two Janus components are present in the device: having one of (the two) Janus components with a fixed positive charge on the surface of the dielectric portion, and the other of (the two) Janus components with a fixed negative charge on the surface of the dielectric portion would meet conditions i and ii. However, as provided below, configurations are considered herein where more than two Janus components are used in the device, e.g., as stacks of components.

The fixed charges on the Janus particles permits the Janus components to be actuated (e.g., turned/moved) during operation of the transistor device in response to an applied gate electrical field. The fact that charges of opposite polarity are employed on the components means that the Janus components will react differently to the same applied gate voltage. See for example FIG. 4 which is an exemplary relay device according to the present techniques. In this example, the relay contains two complementary Janus components, one having a fixed positive charge and one having a fixed negative charge—with the charges being present on the surface of the same (dielectric or metal) portion in both of the Janus components. In accordance with FIGS. 1A-D, the darker surface is (arbitrarily) used herein to represent the metal portion of the component and thus, in FIG. 4, it can be assumed that a fixed negative surface charge has been formed on the surface of the metal portion of one of the two components and a fixed positive surface charge has been formed on the surface of the metal portion of the other component. It is also notable that while FIG. 4 depicts Janus particles, any of the other Janus component shapes (e.g., cylinders, prisms, etc.—as described above) can be employed in the same manner as shown.

Figure 4:
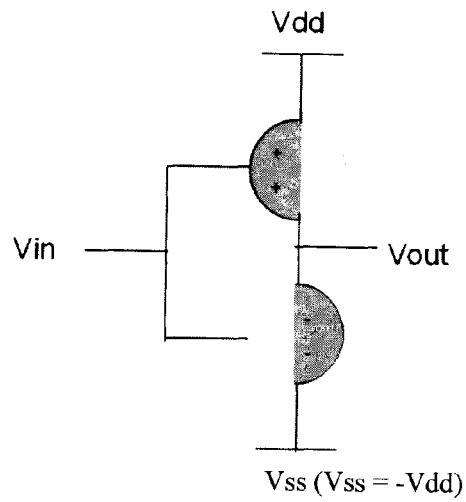
FIG. 4 is a schematic diagram illustrating an exemplary relay device having complementary Janus components according to an embodiment of the present invention.
Figure 5:
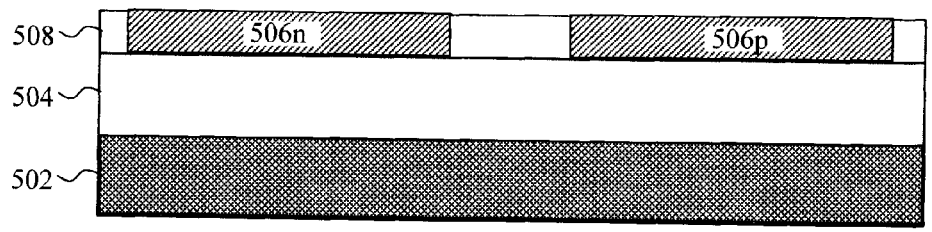
FIG. 5 is a cross-sectional diagram illustrating a starting structure for fabricating a complementary Janus component device wherein back gates of the device are formed in a dielectric on a substrate according to an embodiment of the present invention.
Figure 6:
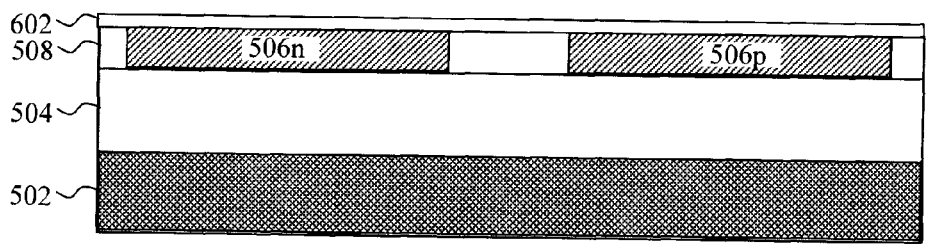
FIG. 6 is a cross-sectional diagram illustrating an etch stop layer having been formed over and covering the back gates according to an embodiment of the present invention.

As shown in FIG. 4, the opposite charges on the two components will result in the components turning/moving differently in response to an applied gate voltage (Vin). Thus, when a negative back gate voltage (Vin<0) is applied, the configuration shown in FIG. 4 is the result. Namely, the positively charged Janus component will actuate (i.e., rotate) its positively charged surface toward the back gate, and the negatively charged Janus component will actuate (i.e., rotate) its negatively charged surface away from the back gate. In the configuration shown, this would result in continuity between the supply voltage (Vdd) and the Vout via the metal portion of the positively charged Janus component. Conversely, if a positive back gate voltage (Vin>0) was applied, then the Janus components would rotate with the positively charged Janus component positioning its positively charged surface facing away from the back gate (not shown). This would position the dielectric portion of the positively charged Janus component between the Vdd and the Vout, thus breaking the continuity between the Vdd and the Vout. Further, by using complementary Janus components, one of the components is always in a non-conducting position (i.e., the dielectric portion is positioned between the Vdd and the Vout) and thus (like a CMOS circuit) the present device draws significant power only momentarily during switching.

An exemplary method for fabricating the present complementary Janus component device is now presented by way of reference to FIGS. 5-14. First, the back gates of the device are formed. See FIG. 5. The starting platform for the fabrication process is a substrate 502 which can be a standard glass, metal, plastic, etc. substrate, or a semiconductor wafer (e.g., bulk semiconductor, silicon-on-insulator (SOI), etc.).

A dielectric layer 504 is then formed on the substrate 502. Layer 504 can be formed from any suitable dielectric material, including but not limited to, oxide and/or nitride materials. According to an exemplary embodiment, dielectric layer 504 is formed having a thickness of from about 100 nanometer (nm) to about 10 micrometers (μm). Next, an N-type back gate 506n and a P-type back gate 506p of the device are formed on dielectric layer 504.

The back gates 506n and 506p can be formed from any suitable conductive gate material, including but not limited to, doped poly-silicon, metal(s), etc. According to an exemplary embodiment, the back gates 506n and 506p are formed by depositing a dielectric layer 508 on dielectric layer 504, patterning dielectric layer 508 with trenches corresponding to the footprint and location of the back gates 506n and 506p, and filling the trenches with a metal (such as copper), poly-silicon, etc. to form the back gates 506n and 506p. Any excess gate material can be removed using, e.g., chemical-mechanical polishing (CMP). Further, while the dielectric 504 and dielectric 508 may be formed from the same material, it may be advantageous to form the dielectric 504 and dielectric 508 from different materials, such as an oxide and a nitride (or vice-a-versa), respectively, so as to permit an etch selectivity between the layers during patterning of the trenches.

An etch stop layer 602 is then formed over and covering the back gates 506n and 506p. See FIG. 6. The etch stop layer 602 will be used later in the process during the anchor trench formation (i.e., to form the trenches into which the Janus components are placed). The etch stop layer will also serve as a dielectric between the Janus components and the back gates 506n and 506p. Accordingly, the etch stop layer is preferably formed from a nitride or oxide dielectric material. By way of example only, the etch stop layer 602 can be deposited using a process such as chemical vapor deposition (CVD) to a thickness of from about 10 nm to about 100 nm.

Figure 7:
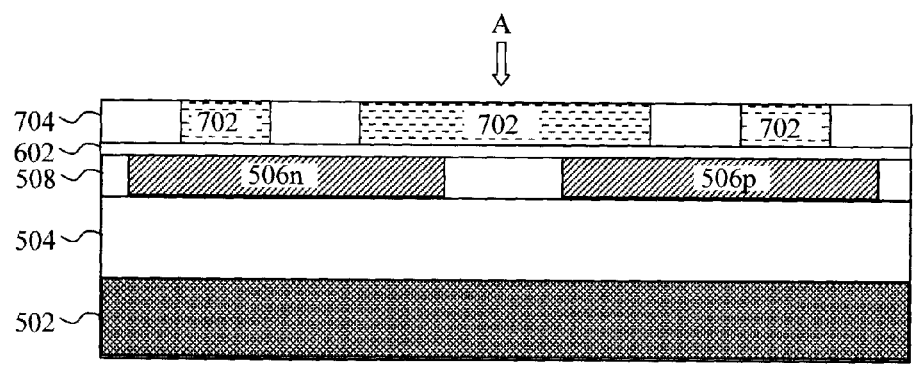
FIG. 7 is a cross-sectional diagram illustrating electrodes having been formed over the back gates according to an embodiment of the present invention.
Figure 8:
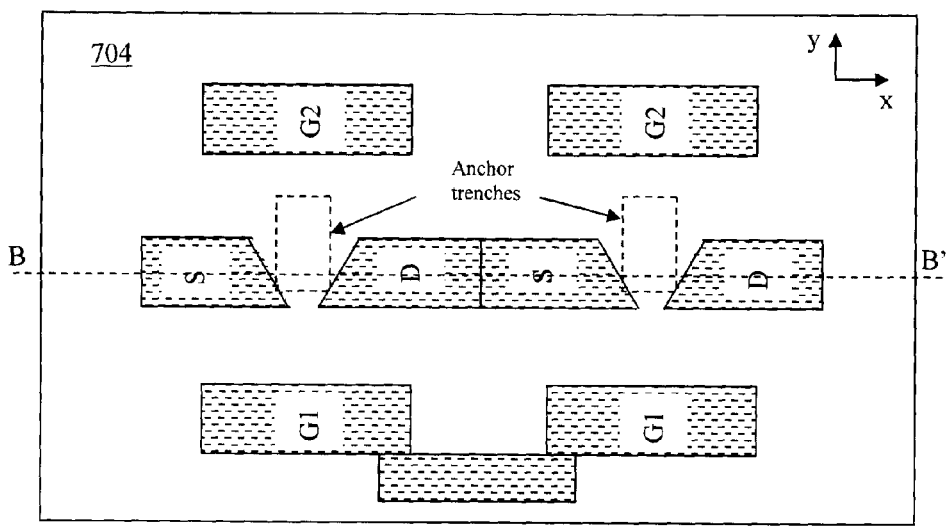
FIG. 8 is a top-down diagram illustrating an exemplary configuration of the electrodes (i.e., including source, drain and gate electrodes) forming a single input/output inverter device according to an embodiment of the present invention.

Next, as shown in FIG. 7, electrodes 702 are formed over the back gates. An exemplary configuration of the electrodes 702 (i.e., including source, drain and gate electrodes) is shown in FIG. 8, described below. The formation of the electrodes 702 follows an analogous process to that described above for forming the back gates. Namely, a dielectric layer 704 is first deposited on the etch stop layer 602, the dielectric layer 704 is patterned with the corresponding footprint and location of the electrodes 702, and the pattern is filled with a conductive material, such as a metal (e.g., copper), poly-silicon, etc. to form the electrodes 702. Any excess conductive material can be removed using, e.g., CMP. Further, as provided above, the etch stop layer 602 is preferably formed from a dielectric material. While the dielectric material used for the etch stop layer 602 may be the same as that used for the dielectric layer 704, it may be advantageous to form the dielectric layer 704 from a different material from the etch stop layer 602, such as an oxide and a nitride (or vice-a-versa), respectively, so as to permit an etch selectivity between the layers during patterning of the dielectric layer 704 to form the electrodes 702, and later to form the anchor trenches—see below.

An exemplary configuration of the electrodes 702 is shown by way of a top-down view of the device presented in FIG. 8. The depiction shown in FIG. 8 is from viewpoint A (see FIG. 7). As shown in FIG. 8, in this exemplary configuration, the electrodes 702 are patterned to form two sets of gate (G1 and G2) and source and drain (S and D) electrodes 702, each set corresponding to one of the (two) complementary Janus component devices. As shown in FIG. 8, there are gaps between each pair of source (S) and drain (D) electrodes, and the gate electrodes (G1 and G2) are located adjacent to the gaps—perpendicular to the source and drain electrodes (i.e., thus if the source and drain electrodes are aligned on the surface of the device along an x-direction, with the gaps therebetween, then the gate electrodes are located on the surface of the device, adjacent to the gaps, along a y-direction, see FIG. 8). The above-described Janus component(s) will be positioned in the gaps. Further, the gaps are angled such that when the metal portion of the Janus component(s) in the gap are facing the gate electrode G1, there is continuity between the source (S) and the drain (D) electrodes. Conversely, when the dielectric portion of the Janus component(s) in the gap are facing the gate electrode G1, there is no continuity between the source (S) and the drain (D) electrodes. Namely, the angled gap ensures that the desired portion of the Janus component (metal or dielectric) makes contact with the source (S) and the drain (D) electrodes. This aspect will become apparent in the description to follow. It is notable that what is shown in FIG. 7 is a cross-sectional cut along line B-B' in FIGS. 8-10.

Figure 9:
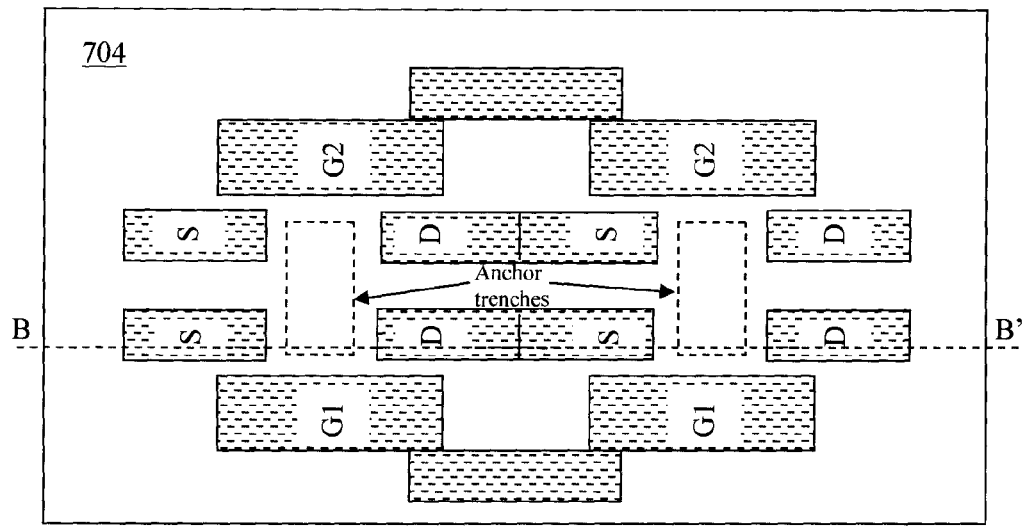
FIG. 9 is a top-down diagram illustrating another exemplary configuration of the electrodes (i.e., including source, drain and gate electrodes) in this case forming a double input/ out inverter device according to an embodiment of the present invention.

Another exemplary configuration of the electrodes 702 is shown by way of a top-down view of the device presented in FIG. 9. Again the depiction shown in FIG. 9 is from viewpoint A (see FIG. 7). The electrode configuration shown in FIG. 9 can, for example, be employed to form a double input/output inverter device.

As shown in FIG. 9, in this exemplary configuration, the electrodes 702 are patterned to form two sets of gate (G1 and G2) and four sets of source and drain (S and D) electrodes 702. As compared to the design shown in FIG. 8, the extra set of source and drain (S and D) electrodes in FIG. 9 permits dual input/output operation. As will be described in detail below, a dual input/output device is applicable in situations where each of the Janus components have both positive and negative charged surfaces, such that one (positive or negative) charged surface interacts with one set of the source (S) and drain (D) electrodes while (at the same time) the other (positive or negative) charged surface interacts with the other (complementary) set of source (S) and drain (D) electrodes. By comparison, the design shown in FIG. 8 can be operated using Janus components having either one or two charged surfaces. This distinction will become further apparent from the description below.

Figure 10:
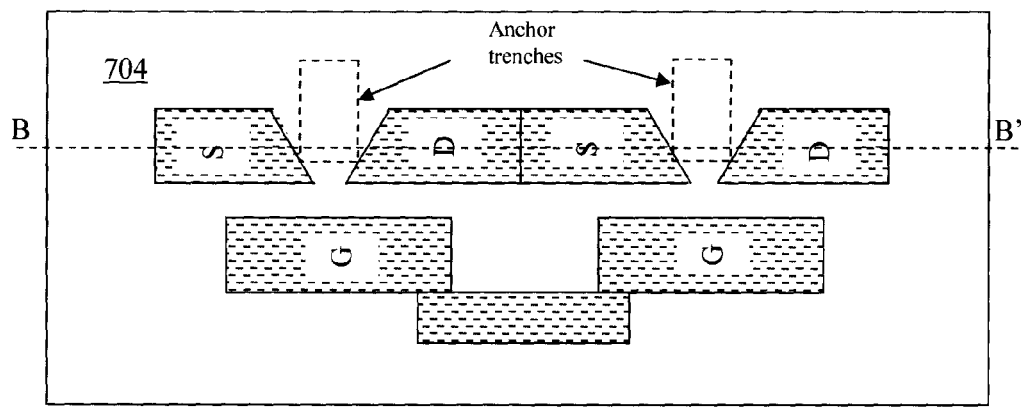
FIG. 10 is a top-down diagram illustrating yet another exemplary configuration of the electrodes (i.e., including source, drain and gate electrodes) forming another single input/output inverter device according to an embodiment of the present invention.

Yet another exemplary configuration of the electrodes 702 is shown by way of a top-down view of the device presented in FIG. 10. Again the depiction shown in FIG. 10 is from viewpoint A (see FIG. 7). Like the design of FIG. 8, the electrode configuration shown in FIG. 10 can, for example, be employed to form a single input/output inverter device.

As shown in FIG. 10, in this exemplary configuration, the electrodes 702 are patterned to form two gates (G) and two sets of source and drain (S and D) electrodes 702. The configuration in FIG. 10 is a simplified version of the single input/output device of FIG. 8. Namely, by comparison with the design of FIG. 8, the configuration in FIG. 10 employs only a single gate electrode (G) for each complementary Janus component device. While the designs shown in FIGS. 8 and 10 operate in the same manner as a single input/output device, simplifying the design decreases manufacturing complexity and production costs.

Figure 11:
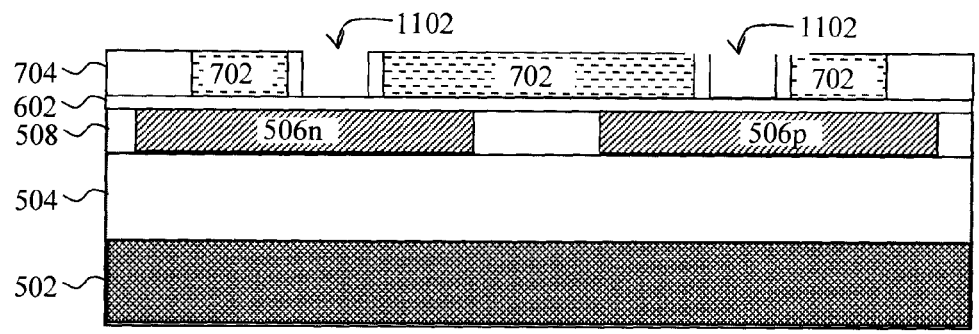
FIG. 11 is a cross-sectional diagram illustrating anchor trenches having been formed in the dielectric layer between the (source and drain) electrodes according to an embodiment of the present invention.

Whichever electrode 702 configuration is employed, the general fabrication process proceeds in the same manner as now described. Namely, as shown in FIG. 11, anchor trenches 1102 are formed in the dielectric layer 704 between the electrodes 702. By way of reference to FIGS. 8-10, the anchor trenches are formed between the source (S) and the drain (D) electrodes. For illustrative purposes, the placement of the anchor trenches 1102 is shown outlined in a dashed pattern in FIGS. 8-10.

According to an exemplary embodiment, the anchor trenches 1102 are formed using standard lithography and etching techniques wherein a mask (not shown) is formed on the dielectric layer 704 patterned with the footprint and location of the anchor trenches 1102. A dielectric reactive ion etching (RIE) step can then be used to etch the anchor trenches in the dielectric layer 704. As provided above, the dielectric layer 704 is preferably formed from a different material than the etch stop layer 602, such as an oxide and a nitride (or vice-a-versa), to provide etch selectivity between the materials. The dimensions of the anchor trench will depend on the dimensions of the particular Janus components being used and whether one or more Janus components will be anchored in the trench—see below description of multi-component embodiments. However, as shown in FIG. 11, it is preferable that a border of dielectric material 704 is left between the edge of the anchor trenches and the electrodes 702.

The Janus particles are then introduced onto the device. As provided above, each device will employ complementary Janus particles. In the simplest case, this includes placing at least one Janus component having a portion (metal or dielectric) with a fixed positive charge and one Janus component having a portion (metal or dielectric) with a fixed negative charge. In that case, a 'chemical approach' may be used to place the Janus components, wherein the device is soaked in an aqueous solution containing the Janus components.

Figure 12:
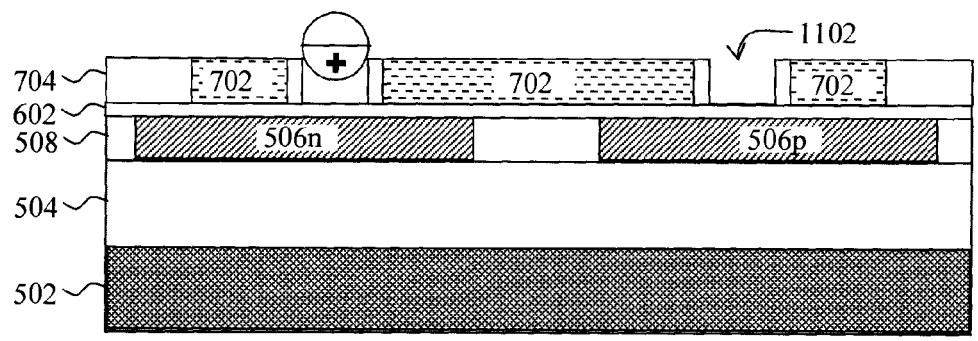
FIG. 12 is a cross-sectional diagram illustrating Janus components being placed in the n-type transistor using a 'chemical approach' wherein the device is contacted with a first aqueous solution containing positively charged Janus components, while a negative gate voltage (V<0) is applied to one of the back gates according to an embodiment of the present invention.

According to an exemplary embodiment, an electrical field is applied to one of the two back gates while the device is soaked in solutions containing the Janus components. For instance, as illustrated in FIG. 12, the device can be soaked in a first solution containing Janus components with a fixed positive charge, while a negative gate voltage (V<0) is applied to one of the back gates 506$n$. See FIG. 12. Accordingly, the fixed positive charge on the particles in the solution will be attracted to the negative charge applied to back gate 506$n$. The anchor trench 1102 (as shown in FIG. 12) in the n-type transistor will serve to physically restrain the Janus component(s) that are deposited in this manner. Alternatively, instead of soaking the device in the Janus component solution, the solution can also be spin-coated onto the surface of the device.

Next, the process can be repeated to deposit a Janus component(s) in the complementary p-type transistor. Here, the device would be soaked in a second solution containing Janus components with a fixed negative charge, while a positive gate voltage (V>0) is applied to the other back gate 506$p$. See FIG. 13. Accordingly, the fixed negative charge on the particles in the solution will be attracted to the positive charge applied to back gate 506$p$. The anchor trench 1102 (as shown in FIG. 12) in the p-type transistor will serve to physically restrain the Janus component(s) that are deposited in this manner. In the example shown in the figures, the Janus components used are Janus particles. However, any of the other Janus component geometries described herein can be employed in the same manner. Alternatively, instead of soaking the device in the Janus component solution, the solution can also be spin-coated onto the surface of the device.

Figure 13:
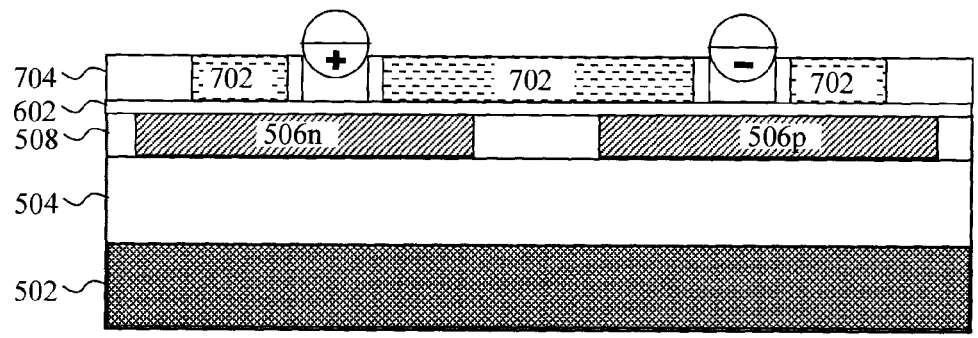
FIG. 13 is a cross-sectional diagram illustrating the chemical approach being used to place negatively charged Janus components in the p-type transistor from a second aqueous solution containing negatively charged Janus components, while a positive gate voltage (V<0) is applied to the other of the back gates according to an embodiment of the present invention.
Figure 14:
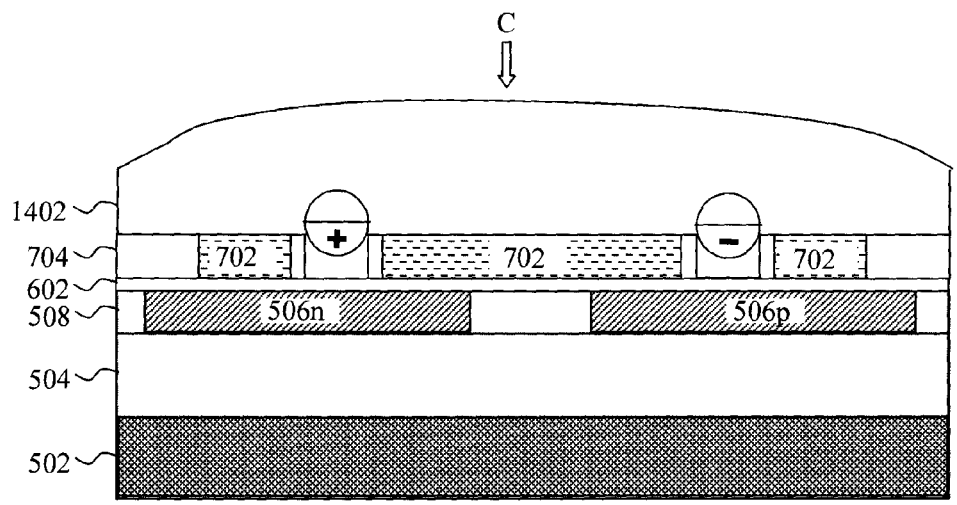
FIG. 14 is a cross-sectional diagram illustrating an optional liquid coating having been deposited over/surrounding the device, covering the Janus components according to an embodiment of the present invention.

This chemical approach can also be used to deposit Janus components having fixed charges on both the surface of the dielectric and metal portions of the component. By way of example only, a first aqueous solution containing Janus components with a fixed positive charge on the dielectric portion and a fixed negative charge on the metal portion can be contacted with the device (through soaking, spin-coating, etc.) while a negative gate voltage is applied to back gate 506$n$—which will deposit the components in the n-type transistor in the same manner as depicted in FIG. 12. Next, a second aqueous solution containing Janus components with a fixed negative charge on the dielectric portion and a fixed positive charge on the metal portion can be contacted with the device (through soaking, spin-coating, etc.) while a positive gate voltage is applied to back gate 506$p$—which will deposit the components in the p-type transistor in the same manner as depicted in FIG. 13.

In an alternate embodiment, rather than using a 'chemical approach,' the Janus components can be placed in the device using a geometric approach wherein the above-described (first, second) aqueous solutions containing the particular charged Janus components are contacted (soaked, spin-coated, etc.) with the device through a patterned mask—for example a photoresist, is placed over the transistor, and patterned to permit deposition of at least one Janus component at the proper location for each of the transistors.

With whatever approach is implemented, following placement of the Janus components in the device, the wafer may be rinsed (for example with distilled water) to remove extra deposited Janus components, and the photoresist (if present) can be removed by conventional processes. As described above, the anchor trenches serve to 'anchor' the Janus components in place during this rinsing step.

Finally, an optional liquid coating 1402 can be deposited over/surrounding the device, covering the Janus components. See FIG. 14. The liquid coating 1402 serves as an insulator and prevents arcing between the electrodes. The liquid coating 1402 may also be referred to herein as a "liquid packaging," and may be formed from an oil-based media (such as a commercially available highly refined transformer oil that is free of water vapor) or an insulating liquid. Fabrication of the Janus component-based device may now be considered complete.

It is notable that the back gates 506$n$ and 506$p$ serve primarily during fabrication to place the Janus components in the proper locations, as described immediately above. The electrodes 702 (of the various configurations presented herein) are used to operate the device. FIGS. 15-17 illustrate operation of the different present device configurations.

Figure 15A:
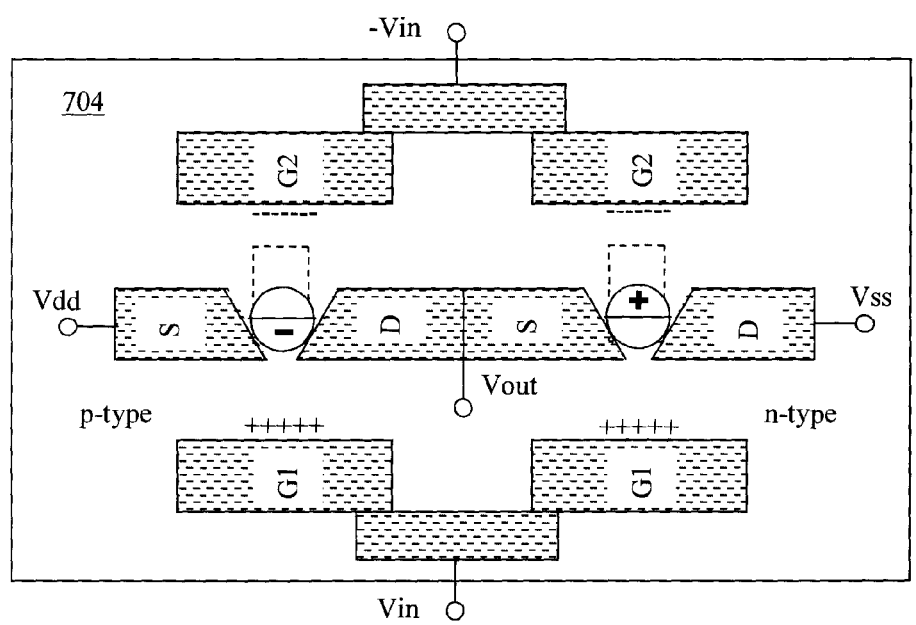
FIG. 15A is a top-down diagram illustrating operation of the single input/output electrode configuration of FIG. 8 when a positive gate voltage is applied according to an embodiment of the present invention.
Figure 15B:
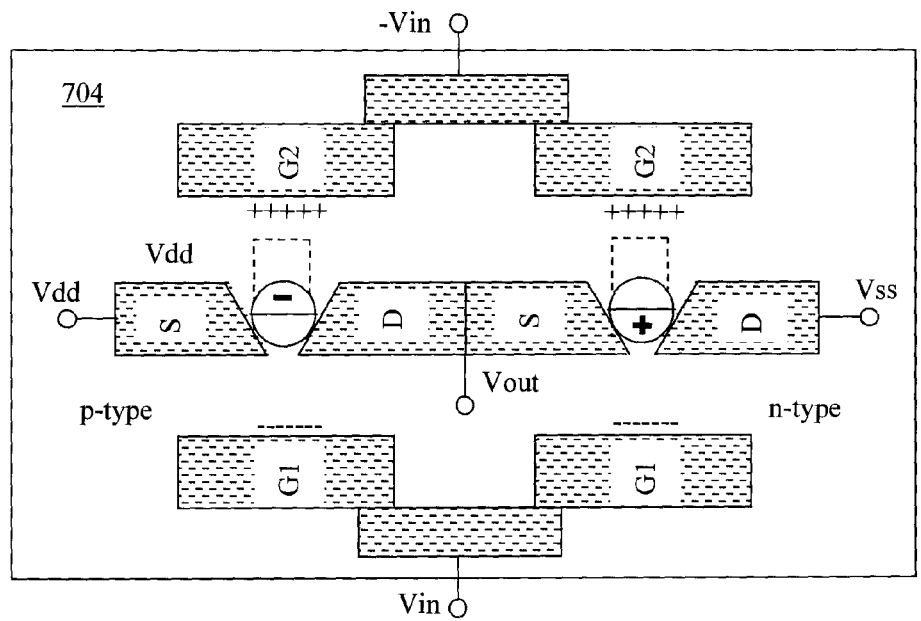
FIG. 15B is a top-down diagram illustrating operation of the single input/output electrode configuration of FIG. 8 when a negative gate voltage is applied according to an embodiment of the present invention.

For example, FIGS. 15A-B are top-down diagrams illustrating the single input/output electrode configuration of FIG. 8. The depictions shown in FIGS. 15A-B are from viewpoint C (see FIG. 14). For ease of depiction, the optional liquid coating 1402 is not shown. Assume for this example that only the surfaces of the dielectric portion of the Janus components have a fixed (positive or negative) charge. Thus, the portions of the Janus components labeled with a charge are the dielectric portions. As shown in FIG. 15A, when a positive gate voltage is applied to the gate electrodes G1 and a complementary negative gate voltage is applied to the gate electrodes G2, the Janus component(s) in the p-type transistor will rotate such that the negatively charged (dielectric) surfaces of those components face the corresponding gate electrode G1—such that the dielectric portion of the Janus component(s) is present between the source (S) and the drain (D) electrodes in the p-type transistor and thus there is no continuity between these electrodes in the p-type transistor. The Janus component(s) in the n-type transistor will rotate such that the positively charged (dielectric) surfaces of those components face away from the corresponding gate electrode G1—such that the metal portion of the Janus component(s) is present between the source (S) and the drain (D) electrodes in the n-type transistor and thus there is continuity between these electrodes in the n-type transistor. In this state, the output (Vout) read through the source (S) and drain (D) electrodes is at low voltage state since there is no continuity between the Vdd and the output (but there is continuity between the Vss and the output). By comparison, as will be described below, the output is at a high voltage state when the device is switched and there is continuity between the Vdd and the output (and no continuity between the Vss and the output).

However, as shown in FIG. 15B, when a negative gate voltage is applied to the gate electrode G1 and a complementary positive gate voltage is applied to the gate electrodes G2, the Janus component(s) in the p-type transistor will rotate such that the negatively charged (dielectric) surfaces of those components face away from the corresponding gate electrode G1—such that the metal portion of the Janus component(s) is present between the source (S) and the drain (D) electrodes in the p-type transistor and thus there is continuity between these electrodes in the p-type transistor. The Janus component(s) in the n-type transistor will rotate such that the positively charged (dielectric) surfaces of those components face the corresponding gate electrode G1—such that the dielectric portion of the Janus component(s) is present between the source (S) and the drain (D) electrodes in the n-type transistor and thus there is no continuity between these electrodes in the n-type transistor. In this state, the output (Vout) read through the source (S) and drain (D) electrodes is at high voltage state since there is now continuity between the Vdd and the output.

Figure 16A:
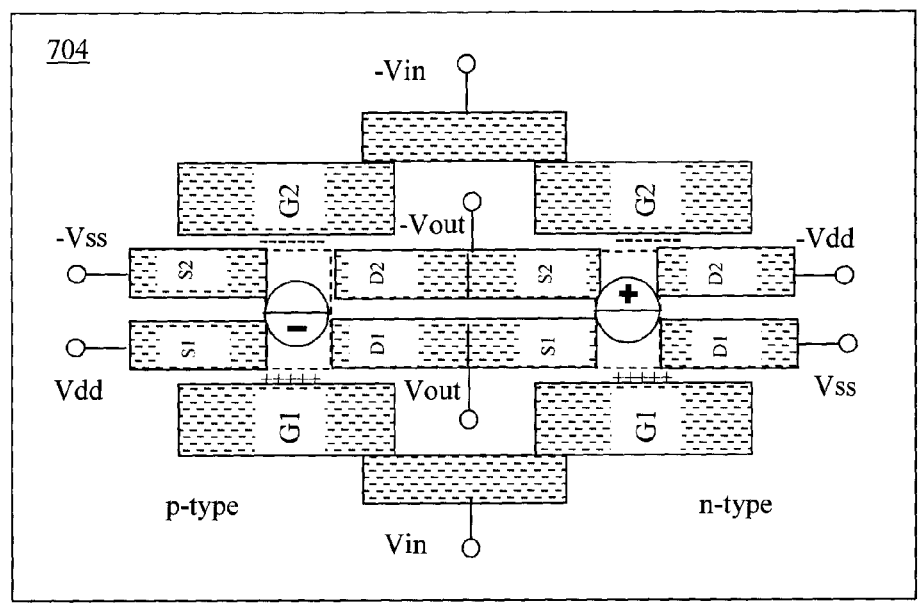
FIG. 16A is a top-down diagram illustrating operation of the double input/output electrode configuration of FIG. 9 when a positive gate voltage is applied according to an embodiment of the present invention.
Figure 16B:
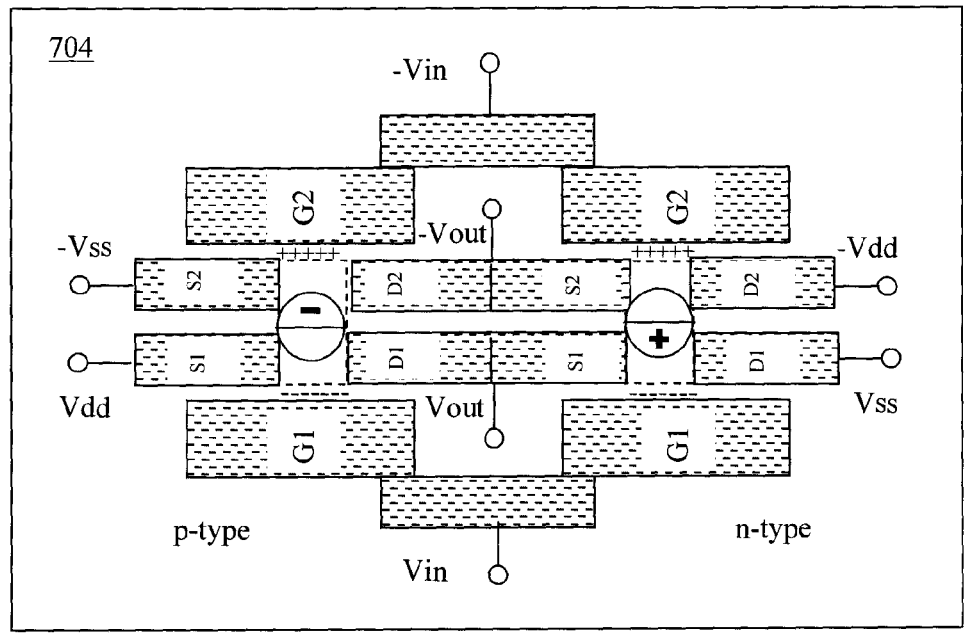
FIG. 16B is a top-down diagram illustrating operation of the double input/output electrode configuration of FIG. 9 when a negative gate voltage is applied according to an embodiment of the present invention.

FIGS. 16A-B are top-down diagrams illustrating the double input/output electrode configuration of FIG. 9. The depictions shown in FIGS. 16A-B are from viewpoint C (see FIG. 14). For ease of depiction, the optional liquid coating 1402 is not shown. Assume for this example that only the surfaces of the dielectric portion of the Janus components have a fixed (positive or negative) charge. Thus, the portions of the Janus components labeled with a charge are the dielectric portions. As shown in FIG. 16A, when a positive gate voltage is applied to the gate electrodes G1 and a complementary negative gate voltage is applied to the gate electrodes G2, the Janus component(s) in the p-type transistor will rotate such that the negatively charged (dielectric) surfaces of those components face the corresponding gate electrode G1—such that i) the dielectric portion of the Janus component(s) is present between the first set of source (S1) and the drain (D1) electrodes in the p-type transistor and thus there is no continuity between these electrodes in the p-type transistor, and ii) the metal portion of the Janus component(s) is present between the second set of source (S2) and the drain (D2) electrodes in the p-type transistor and thus there is continuity between these electrodes in the p-type transistor. The Janus component(s) in the n-type transistor will rotate such that the positively charged (dielectric) surfaces of those components face away from the corresponding gate electrode G1—such that i) the metal portion of the Janus component(s) is present between the first set of source (S1) and the drain (D1) electrodes in the n-type transistor and thus there is continuity between these electrodes in the n-type transistor, and ii) the dielectric portion of the Janus component(s) is present between the second set of source (S2) and the drain (D2) electrodes in the n-type transistor and thus there is no continuity between these electrodes in the n-type transistor. In this state, i) the output (Vout) read through the first set of source (S1) and drain (D1) electrodes is 0 since there is no continuity between the Vdd and the output through S1 and D1, and ii) the complementary output (−Vout) read through the second set of source (S2) and drain (D2) electrodes is at a high voltage state (−Vss) since there is continuity between the −Vss and the output through S2 and D2.

However, as shown in FIG. 16B, when a negative gate voltage is applied to the gate electrode G1 and a complementary positive gate voltage is applied to the gate electrodes G2, the Janus component(s) in the p-type transistor will rotate such that the negatively charged (dielectric) surfaces of those components face away from the corresponding gate electrode G1—such that i) the metal portion of the Janus component(s) is present between the first set of source (S1) and the drain (D1) electrodes in the p-type transistor and thus there is continuity between these electrodes in the p-type transistor, and ii) the dielectric portion of the Janus component(s) is present between the second set of source (S2) and the drain (D2) electrodes in the p-type transistor and thus there is no continuity between these electrodes in the p-type transistor. The Janus component(s) in the n-type transistor will rotate such that the positively charged (dielectric) surfaces of those components face the corresponding gate electrode G1—such that i) the dielectric portion of the Janus component(s) is present between the first set of source (S1) and the drain (D1) electrodes in the n-type transistor and thus there is no continuity between these electrodes in the n-type transistor, and ii) the metal portion of the Janus component(s) is present between the second set of source (S2) and the drain (D2) electrodes in the n-type transistor and thus there is continuity between these electrodes in the n-type transistor. In this state, i) the output (Vout) read through the first set of source (S1) and drain (D1) electrodes is positive since there is continuity between the Vdd and the output through S1 and D1, and ii) the output (Vout) read through the second set of source (S2) and drain (D2) electrodes is negative since there is continuity between the input −Vdd and the output through S2 and D2.

Figure 17A:
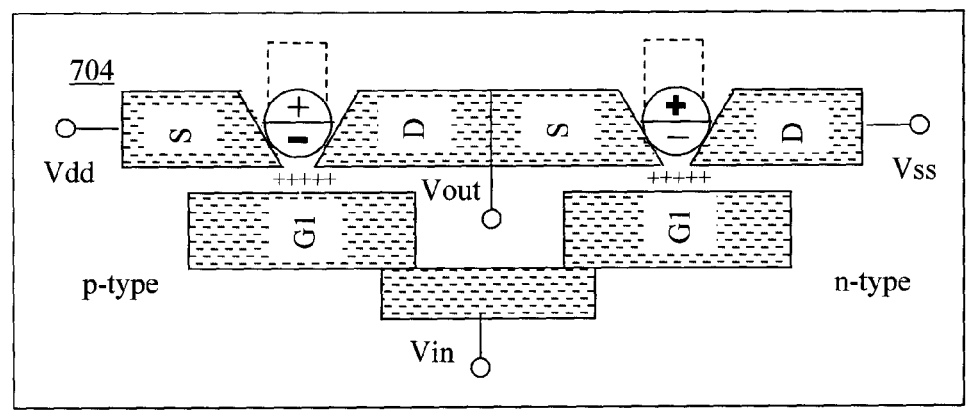
FIG. 17A is a top-down diagram illustrating operation of the single input/output electrode configuration of FIG. 10 when a positive gate voltage is applied according to an embodiment of the present invention.
Figure 17B:
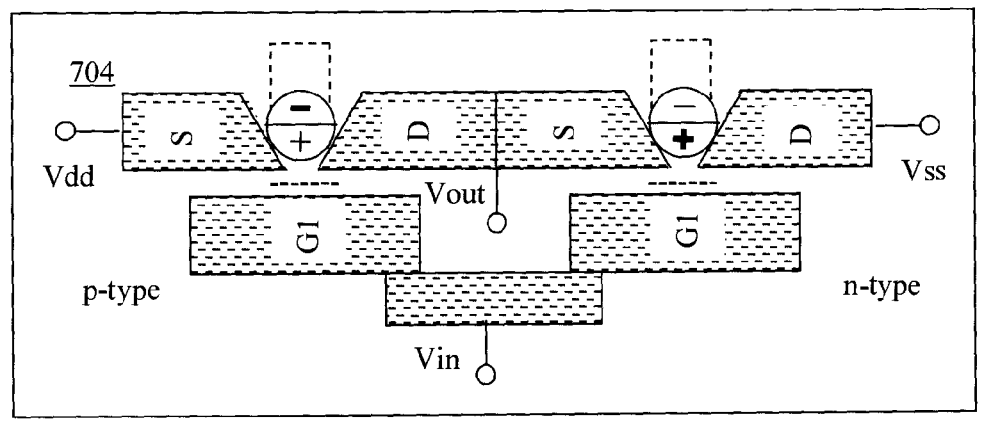
FIG. 17B is a top-down diagram illustrating operation of the single input/output electrode configuration of FIG. 10 when a negative gate voltage is applied according to an embodiment of the present invention.

FIGS. 17A-B are top-down diagrams illustrating the single input/output electrode configuration of FIG. 10. The depictions shown in FIGS. 17A-B are from viewpoint C (see FIG. 14). For ease of depiction, the optional liquid coating 1402 is not shown. Assume for this example that the surfaces of the dielectric portion of the Janus components have a fixed (positive or negative) charge and the surfaces of the metal portions of the Janus components also have a fixed (positive or negative) charge, and wherein the surfaces of the dielectric and metal portions have an opposite charge from one another. To illustrate this configuration, in FIGS. 17A and 17B, the charge on the dielectric surfaces of the Janus components is shown in bold and the charge on the metal surface of the Janus components is shown in regular (unbold) text. Thus, the portions of the Janus components labeled with a charge in bold are the dielectric portions. As shown in FIG. 17A, when a positive gate voltage is applied to the gate electrodes G1, the Janus component(s) in the p-type transistor will rotate such that the negatively charged (dielectric) surfaces of those components face (and the positively charged (metal) surfaces of those components face away from) the corresponding gate electrode G1—such that the dielectric portion of the Janus component(s) is present between the source (S) and the drain (D) electrodes in the p-type transistor and thus there is no continuity between these electrodes in the p-type transistor. The Janus component(s) in the n-type transistor will rotate such that the positive charged (dielectric) surfaces of those components face away from (and the negatively charged (metal) surfaces of those components face) the corresponding gate electrode G1—such that the metal portion of the Janus component(s) is present between the source (S) and the drain (D) electrodes in the n-type transistor and thus there is continuity between these electrodes in the n-type transistor. In this state, the output read through the source (S) and drain (D) electrodes is at a low voltage state since there is no continuity between the Vdd and the output, and there is continuity between the Vss and the output.

However, as shown in FIG. 17B, when a negative gate voltage is applied to the gate electrodes G1, the Janus component(s) in the p-type transistor will rotate such that the positively charged (metal) surfaces of those components face (and the negatively charged (dielectric) surfaces of those components face away from) the corresponding gate electrode G1—such that the metal portion of the Janus component(s) is present between the source (S) and the drain (D) electrodes in the p-type transistor and thus there is continuity between these electrodes in the p-type transistor. The Janus component(s) in the n-type transistor will rotate such that the negatively charged (metal) surfaces of those components face away from (and the positively charged dielectric surfaces of those components will face) the corresponding gate electrode G1—such that the dielectric portion of the Janus component(s) is present between the source (S) and the drain (D) electrodes in the n-type transistor and thus there is no continuity between these electrodes in the n-type transistor. In this state, the output read through the source (S) and drain (D) electrodes is at high voltage state since there is now continuity between the Vdd and the output.

As provided above, any of the Janus component geometries described herein may be used in any of the device configurations shown. Further, a single or multiple Janus components may be used in each of the (n-type and p-type) Janus transistors described herein. The implementation of a single Janus particle in each (n-type or p-type) transistor was demonstrated in FIGS. 15-17. It is also possible to employ multiple Janus particles in a given (n-type or p-type) transistor which function in the same manner as a single component. The multiple Janus particles can be implemented in series (see FIG. 18) or in parallel (see FIG. 19).

Figure 18:
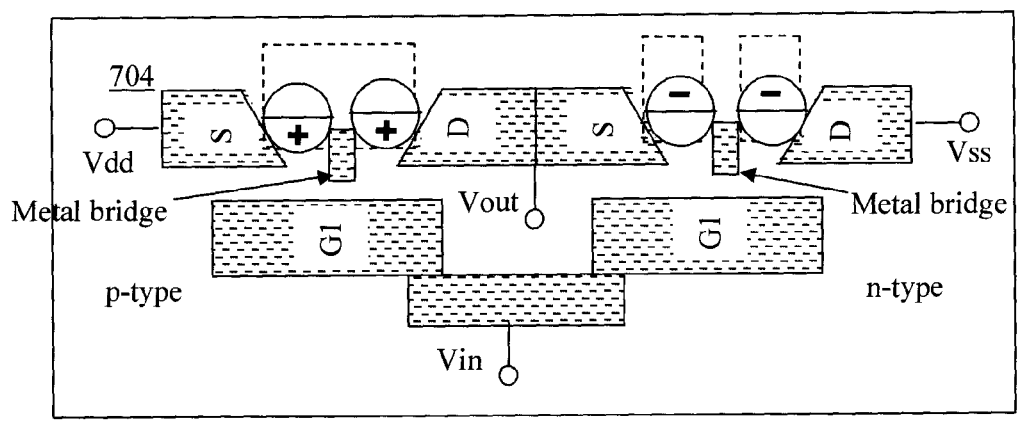
FIG. 18 is a cross-sectional diagram illustrating multiple Janus particles connected in series in each (n-type or p-type) transistor according to an embodiment of the present invention.

FIG. 18 is a diagram illustrating multiple Janus particles connected in series in each (n-type or p-type) transistor. For illustrative purposes only, the single input/output electrode configuration of FIG. 10 is shown. Due to the shape of the (spherical) Janus particles shown in FIG. 18, it may be desirable to form a metal bridge in between the source and drain electrodes to ensure that continuity will be achieved between the particles. Specifically, due to the spherical shape of the particles, the amount of surface area available for contact between the particles is small. The metal bridge increases this contact area. While only one metal bridge is shown in FIG. 18, it is to be understood that multiple metal bridges may be employed to 'bridge' the gap between Janus particles—depending on how many Janus particles are present with one bridge being present between each pair of particles. For instance, if three Janus particles were employed in series, then two metal bridges would preferably be employed. According to an exemplary embodiment, the metal bridge(s) is/are formed (from Cu) at the same time as the formation of the electrodes 702.

As described above, the spherical shape of the Janus particles limits the contact area between particles (in the case of multiple particles in series), thus making use of a metal bridge (as shown in FIG. 18) preferable. By contrast, when the Janus components are cylindrical or prism-shaped, then the use of a metal bridge is likely unnecessary.

The multiple Janus components (in series) may be anchored using one anchor trench, or multiple anchor trenches wherein each anchor trench anchors at least one Janus component. For illustrative purposes only, a single anchor trench is shown in FIG. 18 in conjunction with the n-type transistor, and multiple anchor trenches are shown in FIG. 18 in conjunction with the p-type transistors. This is done to illustrate how either single or multi-trench configuration may be used, however it is likely for production purposes that one configuration (single or multi-trench) would be selected and implemented for both (n-type and p-type) transistors. The use of multiple Janus components (in series and in parallel) in a transistor device is also described in U.S. patent application Ser. No. 13/665,334.

When multiple Janus components are used in parallel (versus in series), as shown in FIG. 19, the anchor trench is made deeper to accommodate a stack of multiple components. For illustrative purposes only, FIG. 19 is a derivation of FIG. 13 showing multiple Janus components in parallel. In this exemplary configuration, a thicker dielectric layer 508 is employed and the anchor trenches have a greater depth d than in the other embodiments shown and described above. The depth of the trenches is dependent on the particular type and shape of the Janus components being employed. Exemplary dimensions for the various types of Janus components were provided above. By way of example only, in one non-limiting example, up to 10 Janus components (e.g., from 1 to 3 Janus components) are placed in series in the device. In the example shown in FIG. 19, 4 Janus components (in this case (spherical) Janus particles) are employed in parallel. It is apparent from FIG. 19 that the Janus components are physically constrained within the anchor trench, and will self align as a stack when deposited into the trench (in the same manner as described above). The switching operation of the device is the same as the single component embodiment, except that in FIG. 19 the components are rotated (and potentially translated—see below) together as a stack. Otherwise the operation is identical between the single- and multi-component configurations.

Like the Janus particles, the Janus cylinders of FIG. 1C also function to switch the device by rotating based on the applied gate voltage. See FIG. 20. Again, for illustrative purposes only, the electrode 702 configuration of FIG. 10 is being used as an example. As with FIG. 17, assume for this example that the surfaces of the dielectric portion of the Janus components have a fixed (positive or negative) charge and the surfaces of the metal portions of the Janus components also have a fixed (positive or negative) charge, and wherein the surfaces of the dielectric and metal portions have an opposite charge from one another. To illustrate this configuration, the charge on the dielectric surfaces of the Janus components is shown in bold and the charge on the metal surface of the Janus components is shown in regular (unbold) text. Thus, the portions of the Janus components labeled with a charge in bold are the dielectric portions.

For some of the other Janus component geometries considered herein, the Janus components actuate/slide within the trenches (rather than rotating). See, for example, FIG. 21 which depicts operation of the present complementary Janus component device employing the Janus cylinders of FIG. 1B and FIG. 22 which depicts operation of the present complementary Janus component device employing the Janus prisms of FIG. 1D. Again, as with FIG. 17, assume for this example that the surfaces of the dielectric portion of the Janus components have a fixed (positive or negative) charge and the surfaces of the metal portions of the Janus components also have a fixed (positive or negative) charge, and wherein the surfaces of the dielectric and metal portions have an opposite charge from one another. To illustrate this configuration, the charge on the dielectric surfaces of the Janus components is shown in bold and the charge on the metal surface of the Janus components is shown in regular (unbold) text. Thus, the portions of the Janus components labeled with a charge in bold are the dielectric portions. These other Janus component geometries are also described in U.S. patent application Ser. No. 13/665,334.

Figure 21:
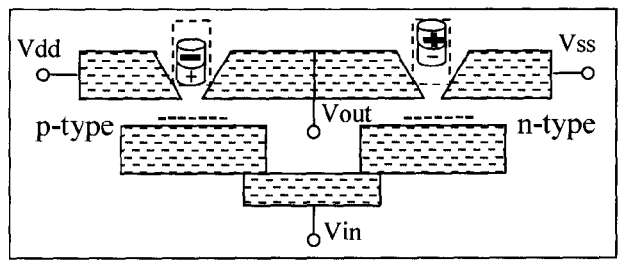
FIG. 21 is a diagram illustrating operation of the present complementary Janus component devices where the Janus components are the Janus cylinders of FIG. 1B according to an embodiment of the present invention.
Figure 21:
Figure 21:
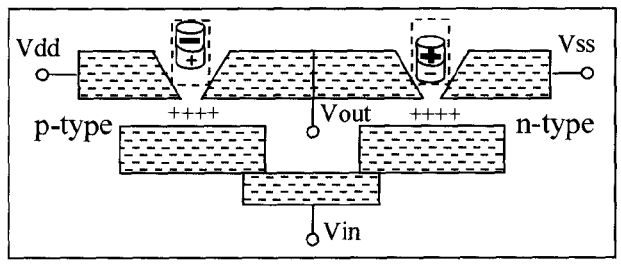
Figure 22:
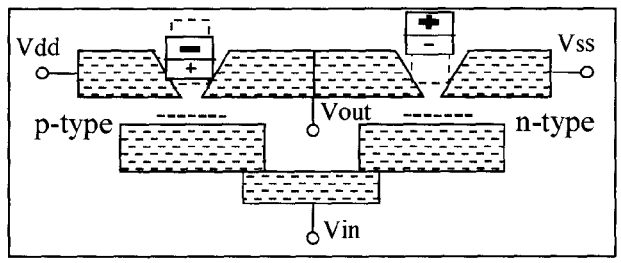
FIG. 22 is a diagram illustrating operation of the present complementary Janus component devices where the Janus components are the Janus prisms of FIG. 1D according to an embodiment of the present invention.
Figure 22:
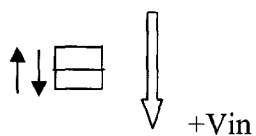
Figure 22:
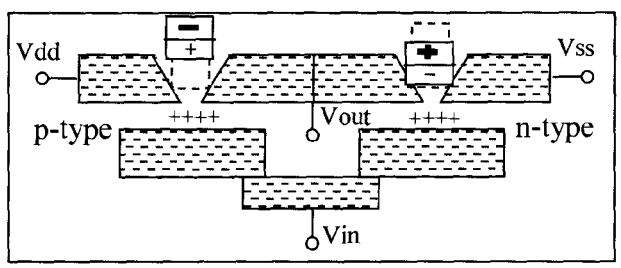

As shown in FIGS. 21 and 22, a positive gate voltage will attract/repel the negative/positive charged surface of the Janus components. This will cause the Janus components to slide within the anchor trenches. As a result, the metal portion of the Janus components will either be present/or actuate (moved) away from between the source and drain electrodes.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating an electromechanical device, the method comprising the steps of:
    forming a first back gate and a second back gate on a first dielectric layer over a substrate;
    forming an etch stop layer covering the first back gate and a second back gate;
    forming electrodes in a second dielectric layer on the etch stop layer over the first back gate and the second back gate, wherein the electrodes comprise one or more gate electrodes, one or more source electrodes and one or more drain electrodes, wherein gaps are present between the source electrodes and the drain electrodes, and wherein the gate electrodes are located adjacent to the gaps, perpendicular to the source and drain electrodes; and
    placing one or more Janus components in each of the gaps between the source and drain electrodes, wherein each of the Janus components includes a first portion comprising an electrically conductive material and a second portion comprising an electrically insulating material, and wherein i) either the first portion or the second portion of the Janus components placed in a first one of the gaps has a fixed positive surface charge and ii) either the first portion or the second portion of the Janus components placed in a second one of the gaps has a fixed negative surface charge.

2. The method of claim 1, wherein the substrate comprises a glass, metal, or plastic substrate.

3. The method of claim 1, wherein the substrate comprises a semiconductor wafer.

4. The method of claim 1, wherein the first back gate and the second back gate are formed from a conductive material selected from the group consisting of: a metal and doped polysilicon.

5. The method of claim 1, wherein the electrically conductive material is a metal.

6. The method of claim 5, wherein the metal is selected from the group consisting of: gold, copper, aluminum, silver, and palladium.

7. The method of claim 1, wherein the electrically insulating material is a dielectric material.

8. The method of claim 1, wherein either a) the first portion of the Janus components placed in the first one of the gaps has a fixed positive surface charge and the second portion of the Janus components placed in the first one of the gaps has a fixed negative surface charge, or b) the first portion of the Janus components placed in the first one of the gaps has a fixed negative surface charge and the second portion of the Janus components placed in the first one of the gaps has a fixed positive surface charge.

9. The method of claim 1, wherein either a) the first portion of the Janus components placed in the second one of the gaps has a fixed positive surface charge and the second portion of the Janus components placed in the second one of the gaps has a fixed negative surface charge, or b) the first portion of the Janus components placed in the second one of the gaps has a fixed negative surface charge and the second portion of the Janus components placed in the second one of the gaps has a fixed positive surface charge.

10. The method of claim 1, wherein multiple Janus components are placed in each of the gaps between the source and drain electrodes, and wherein the multiple Janus components are connected in series.

11. The method of claim 1, wherein multiple Janus components are placed in each of the gaps between the source and drain electrodes, and wherein the multiple Janus components are connected in parallel.

12. The method of claim 1, wherein the electrodes comprise a first and a second set of the gate electrodes, and a first and a second set of the source and drain electrodes,
    wherein the first set of the gate electrodes, the first set of the source and drain electrodes and the Janus components placed in the first one of the gaps form a first transistor, and
    wherein the second set of the gate electrodes, the second set of the source and drain electrodes and the Janus components placed in the second one of the gaps form a second transistor.

13. The method of claim 1, wherein the electrodes comprise a first and a second set of the gate electrodes, and two first and two second sets of the source and drain electrodes,
    wherein the first set of the gate electrodes, the two first sets of the source and drain electrodes and the Janus components placed in the first one of the gaps form a first transistor, and
    wherein the second set of the gate electrodes, the two second sets of the source and drain electrodes and the Janus components placed in the second one of the gaps form a second transistor.

14. The method of claim 1, wherein the electrodes comprise a first and a second one of the gate electrodes, and a first and a second set of the source and drain electrodes,
    wherein the first gate electrode, the first set of the source and drain electrodes and the Janus components placed in the first one of the gaps form a first transistor, and
    wherein the second gate electrode, the second set of the source and drain electrodes and the Janus components placed in the second one of the gaps form a second transistor.

15. A method of operating an electromechanical device, the method comprising the steps of:
    providing the electromechanical device having: a first back gate and a second back gate on a first dielectric layer over a substrate; an etch stop layer covering the first back gate and a second back gate; electrodes formed in a second dielectric layer on the etch stop layer over the first back gate and the second back gate, wherein the electrodes comprise one or more gate electrodes, one or more source electrodes and one or more drain electrodes, wherein gaps are present between the source electrodes and the drain electrodes, and wherein the gate electrodes are located adjacent to the gaps, perpendicular to the source and drain electrodes; and one or more Janus components placed in each of the gaps between the source and drain electrodes, wherein each of the Janus components includes a first portion comprising an electrically conductive material and a second portion comprising an electrically insulating material, and wherein i) either the first portion or the second portion of the Janus components placed in a first one of the gaps has a fixed positive surface charge and ii) either the first portion or the second portion of the Janus components placed in a second one of the gaps has a fixed negative surface charge; and applying a gate voltage to the gate electrodes to move the Janus components so as to position either: a) the first portion of the Janus components placed in the first one of the gaps between a first set of the source and drain electrodes and the second portion of the Janus components placed in the second one of the gaps between a second set of the source and drain electrodes, or b) the second portion of the Janus components placed in the first one of the gaps between the first set of the source and drain electrodes and the first portion of the Janus components placed in the second one of the gaps between the second set of the source and drain electrodes.

* * * * *